(12) United States Patent
Barte et al.

(10) Patent No.: US 6,321,443 B1
(45) Date of Patent: Nov. 27, 2001

(54) CONNECTION SUBSTRATE

(75) Inventors: Hans-Jürg Barte, Wilberg-Sulz (DE); Ewald Losert, Pratteln (CH); Heinrich Meyer, Berlin (DE); Günter Röhrs; Frank Rudolf, both of Obercardorf (DE); Wolfgang Scheel, Berlin (DE); Walter Schmidt, Russikon; Theis Zur Nieden, Schoenaich, both of (CH)

(73) Assignees: Dyconex Patente AG, Zug (CH); Atotech Deutschland GmbH, Berlin (DE); Ciba Specialty Chemicals Holding, Inc., Basel (CH); Fraunhofer-Gesellschaft zur Foerderung der Angewandten, Forschung E.V., Munich; Techn. Universitaet Dresden, Dresden, both of (DE)

( * ) Notice: Subject to any disclaimer, the term of this patent is extended or adjusted under 35 U.S.C. 154(b) by 0 days.

(21) Appl. No.: 08/973,924
(22) PCT Filed: Jun. 6, 1996
(86) PCT No.: PCT/CH96/00218
   § 371 Date: May 13, 1998
   § 102(e) Date: May 13, 1998
(87) PCT Pub. No.: WO97/00598
   PCT Pub. Date: Jan. 3, 1997

(30) Foreign Application Priority Data

Jun. 15, 1995 (CH) ................................... 1768-95

(51) Int. Cl.⁷ ..................................................... H05K 3/20
(52) U.S. Cl. ................................ 29/831; 29/846; 428/901
(58) Field of Search ........................... 29/830, 831, 846; 174/254; 361/704, 719–712, 749–751, 794; 428/901

(56) References Cited

U.S. PATENT DOCUMENTS 3,766,439  10/1973  Isaacson ............................... 317/100

(List continued on next page.)

FOREIGN PATENT DOCUMENTS 1 932 380   1/1971  (DE) .

(List continued on next page.)

OTHER PUBLICATIONS

IBM Technical Disclosure Bulletin, vol. 36, No. 06A, Jun. 1993, New York, NY, pp. 333–334, "Composite Card to Provide Uniform Cooling to Single Chip Modules with Large Z Tolerance".

Primary Examiner—Gregory Thompson
(74) Attorney, Agent, or Firm—Rankin, Hill, Porter & Clark LLP

(57) ABSTRACT

The method for the manufacture of multilayer connecting substrates with multiple functions comprises the design of the connecting substrate taking place in functionally separated manner, in that signal conducting substrate parts (19), power supplying substrate parts (2), mechanical substrate parts (7), as well as the arrangement of components (4) or component-carrying substrate parts is separately planned and optimized as independent functions or modules and finally associated with spatially separated functional areas (inner/outer) of the overall circuit, the design taking place by the connection of the modules to an overall circuit embodying the connecting substrate. The resulting multilayer circuit with conductor network (19, 2), components (4) and mechanical stiffening elements (7) has the following structure. The substrate parts with the fine, dense and flexible elements are associated with the inner areas of the overall circuit, the substrate parts with the rigid elements and/or components are associated with the outer areas of the overall circuit and a stiffening support material is so placed in the outer area that the circuit is given a mechanical support structure, which is designed in locally rigid manner passing into flexible areas. The overall circuit is folded and/or wound corresponding to the rigid and flexible portions. The mechanical support structure can be formed by separately produced apparatus housing parts or by the apparatus housing.

6 Claims, 7 Drawing Sheets

U.S. PATENT DOCUMENTS

| | | | |
|---|---|---|---|
| 4,744,008 | 5/1988 | Black et al. ........................... | 361/386 |
| 4,830,691 | 5/1989 | Kida et al. . | |
| 4,858,071 | 8/1989 | Manabe et al. ....................... | 361/386 |
| 5,072,074 * | 12/1991 | Demaso et al. ....................... | 174/254 |
| 5,121,297 * | 6/1992 | Haas ..................................... | 361/749 |
| 5,206,463 * | 4/1993 | Demaso et al. ....................... | 428/901 |
| 5,616,888 * | 4/1997 | Mclaughlin et al. ................. | 174/254 |
| 5,831,828 * | 11/1998 | Cutting ................................. | 361/704 |

FOREIGN PATENT DOCUMENTS

| | | |
|---|---|---|
| 197 516 | 10/1986 | (EP) . |
| 451 541 | 10/1991 | (EP) . |
| 632 685 | 1/1995 | (EP) . |
| 2117172 | 7/1972 | (FR) . |
| 93/26 143 | 12/1993 | (WO) . |
| 93/26 146 | 12/1993 | (WO) . |

* cited by examiner (a)

(b)

CONNECTION SUBSTRATE

The invention is in the field of the manufacture of printed circuit boards and more particularly relates to multilayer, electrical and optical connecting substrates having multiple functions and a method for the manufacture thereof as a whole or the starting and intermediate products thereof.

Printed circuit boards are nowadays ever more complex electromechanical and even opto-electromechanical multilayer structures, during whose development and manufacture it is necessary to fulfil a number of functions, which can be subdivided into primary and secondary functions.

Primary functions e.g. relate to the presence of signal conductors to the components and the power supply of said components. It also relates to the provision of a mechanically manipulatable support or carrier structure with suitable assembly or mounting faces for components to be loaded and standardized interfaces for connection to other system parts.

Secondary functions e.g. relate to the electromagnetic shielding of the printed circuit board and to the integration of passive electrical components such as resistors, capacitors, inductance coils and passive optical components such as waveguides, splitters, combiners, mirrors, into the actual connecting substrate. They relate to mechanical functions such as the adaptation of the temperature coefficient of the support structure to the components. In addition, flexible connecting elements can be integrated into the connecting substrate. They also relate to thermal functions, such as passive or active cooling and heat management, i.e. heat distribution or dissipation.

Hereinafter are described disadvantages of conventional multilayer structure from the standpoint of the primary and secondary functions.

Undifferentiated mixing of the functions: nowadays primary and secondary functions, as enumerated hereinbefore, are "merged" into a unit. Such an undifferentiated multilayer structure is e.g. disclosed in FR-2,117,172 and U.S. Pat. No. 4,830,691. In such multilayer structures signal conductors and power supply conductors are embedded in a dielectric serving as a mechanical support. Components are connected by layers of signal conductors and power supply conductors. Several such layers are interconnected by means of interfacial connections, which pass through several planes. It is disadvantageous that the relatively long and therefore necessarily large diameter through holes have to pass through the entire multilayer structure. It is also disadvantageous that the interfacial connections often have to pierce electrically conductive planes, which makes necessary additional precautions against short-circuits.

Complexity of the undifferentiated mixing: modern integrated circuits are ever more complex with respect to their functions and are used in ever larger numbers on printed circuit boards. In addition, the switching frequencies are rising. This leads to high layer, densely wired multilayer structures, which simultaneously must dissipate high power losses. This high heat production requires additional heat conducting elements, whose thermal interfacial connections take up wiring space, whose layout additionally increases the complexity of the multilayer structures, which may give rise to compatibility problems. With such "merged" units, modifications and redesign can lead to project delays. It is also disadvantageous that it is difficult or even impossible to pretest the inner wiring planes of the multilayer structures, which gives rise to a reduced efficiency risk.

Miniaturization: miniaturization is no longer limited to the smallest dimensions of conductor spacings in integrated circuits and instead applies to the actual equipment. Pocket televisions, portable personal computers (laptops to palmtops), hand cameras and other highly complex equipment necessarily require connecting substrates with small dimensions. It is therefore necessary to adapt the shape and design of the connecting substrates to the equipment shapes. Suitable for this purpose are flexible, particularly rigid-flexible connecting substrates with flexible connectors, such as flexible extension arms and interfaces. It is known that the manufacture of rigid-flexible connecting substrates according to conventional methods is complicated and expensive.

Heat dissipation and waste heat control: nowadays the heat dissipation generally takes place by introduction via heat conducting materials into the multilayer structure. Such a heat dissipating multilayer structure is e.g. disclosed in EP-451,541. In the interior of the multilayer structure the heat is passed via heat conducting materials and over relatively large distances to the border or edge of the multilayer structure. In order to solve this thermal problem, it is necessary to have galvanic interfacial connections, whose task is merely to direct the heat into and then out of the connecting substrate.

The problem of the present invention is to seek a solution with which it is possible to fundamentally avoid the disadvantages of the necessarily increasing complexity of modern connecting substrates. The invention provides a multilayer structure with high density connecting networks, which allows a good heat management, whose components are connected by means of very short signal conductors, whose electrical or optical circuit can be pretested and where the rigid-flexible portions can be easily produced with different hardnesses and bending radii. However, it must be possible to use in preferred manner known, proven methods, materials, etc. For example, for the production of the conductor structures, it must be possible to use known wet chemical and etching methods. The further processing, particularly the loading and contacting, must be compatible with known systems, e.g. soldering, wire bonding, etc.

The set problem is solved by the invention defined in the claims.

The idea according to the invention is based on functional analysis or, in other words, the differentiation of a functionally separated structural principle of functions such as "power supply", "signal conductor", "mechanical support", "assembly faces", "heat sinks", "flexible connectors" and "interfaces to the exterior".

This analysis shows that the observed complexity of modern connecting substrates can essentially be reduced to the interaction of two characteristics, namely the interaction of the functional complexity with the structural complexity.

Functional complexity and structural complexity are proportional to one another and in each case comprise three basic characteristics, which electrical and/or optical connecting substrates have to fulfil, namely signal switching, thermal and mechanical characteristics. The denser the desired signal switching, functional complexity (high data throughout) is to be, the higher the requirements made on the signal switching, structural complexity (conductor and component density) of the connecting substrate. The higher the resulting thermal, functional complexity (heat densities and gradients), the more effective must be the thermal, structural complexity (thermal layout, heat sinks) of the connecting substrates. The higher the mechanical, functional complexity (hardnesses, bending radii and stiffnesses) as a local function on the connecting substrates, the higher the demands made on the mechanical, structural complexity (rigid-flexible areas, local stiffness, etc.) of the connecting substrate.

The presently worked out, proportional interconnection between the functional complexity and structural complexity, as well as the minimum set of necessary characteristics, here the signal switching, thermal and mechanical characteristics, covers and completely describes the functions for the purpose of a functionally separated design of a connecting substrate.

From the standpoint of the functional and structural complexity and their characteristics, the set problem of the invention can be reworded. In a first approximation signal switching, thermal and mechanical characteristics of the structural complexity of connecting substrates to be manufactured can be considered in two spatial structural areas, namely "internal" and "external".

The thermal, structural complexity must be such that the heat is passed to the outside and not to the inside. First prerequisite for connecting substrates is externally "warm" and internally "cool".

The signal switching, structural complexity is to be on the inside and not the outside of connecting substrates and must be over short paths. Second prerequisite for connecting substrates is internally "fine" and "dense".

The mechanical, structural complexity must be variably designable over the entire extension of the connecting substrates. The local strength can be both in the inner "fine" and "dense" and in the outer functional areas. In order to obtain a great variability of different mechanical characteristics, outer structural areas are to have high stiffnesses and strengths. Third prerequisite for connecting substrates is externally "rigid", "coarse" and internally "flexible".

It is clear that the approximate structural prerequisites with respect to the terms "warm", "cold", "fine", "dense", "rigid", "coarse", "flexible", etc. must be understood in the transmitted sense. "Fine" and "flexible" e.g. mean fine structures, such as ultra-fine conductors on flexible foils or films, whilst "coarse" e.g. means coarse structures, such as external dimensions of components, shields, etc.

The solution principle according to the invention for obtaining a high structural complexity and for obtaining a high functional complexity is to associate the functions such as "power supply", "signal conductor", "mechanical support", "assembly faces", "heat dissipation", "flexible connectors" and "interfaces to the exterior" in accordance with the approximate structural prerequisites:
inner : fine, dense, flexible and cool
outer : coarse, rigid and warm, to be associated with spatially logically separated functional areas, whilst separately logically optimizing them and combining them to a functionally separated structural design. This leads to a modular arrangement of the functional areas, which permit a functionally specific optimization and the use of functionally specific materials and which are combined in modular form in structural areas. This procedure differs from the prior art through the avoidance of a differentiated mixing and the merging of functions in structural areas.

The inventive production method for starting and intermediate products and connecting substrates according to the approximate prerequisites forms modular designed functional units and combines same in optimum manner in a new hierarchic union. For this purpose is e.g. used a special design process taking account of the inventive function separating method, which transforms the structural prerequisites taking account of mutual functional influencing quantities into functionally separated structural areas.

With the fine, dense, flexible and cool inner areas are associated connecting networks for "signal conductors", for "power supply", as "flexible connectors" and as "interfaces to the exterior".

With the coarse, rigid and warm outer areas are associated mechanical stiffening elements as "mechanical supports", and as "assembly surfaces", as well as thermal cooling elements as "heat sinks".

Such initial and intermediate products and connecting substrates produced and functionally separated in this way can be bent round flexible connection points and consequently folded and/or wound and rendered compact, so that through a subsequent stiffening by means of mechanical support material strengthened connecting substrate bodies are obtained. The functionally separated combination e.g. leads to the advantage that in this way for stiffening purposes use can be made of mechanical support material e.g. in the form of inexpensive plastics materials not exposed to the relatively high temperatures during preceding or other production stages, e.g. during the assembly process. Stiffening takes place in a planned, local manner, so that the starting and intermediate products and connecting substrates can be flexibly connected to the exterior by means of unstiffened interface areas forming part of the flexible signal connection network.

The procedure according to the invention and the starting, intermediate products and connecting substrates produced are described in greater detail hereinafter relative to the attached drawings, wherein show:

FIGS. 1 & 2 Parts of typical embodiments of the prior art connecting substrates.

FIG. 3 Part of an exemplified embodiment of the inventively produced connecting substrate.

FIG. 4 Part of an exemplified embodiment of an inventively produced signal connecting network (electrical connections) combined in further stages to form a complete connecting substrate.

FIGS. 5(a) & (b) Parts of further exemplified embodiments of an inventively produced signal connecting network (optical connections) combined in further stages to form a complete connecting substrate.

FIG. 6 Part of a further exemplified embodiment of an inventively produced signal connecting network with different embodiments of signal paths between components combined in further stages to a complete connecting substrate.

FIGS. 7 & 8 Parts of further exemplified embodiments of inventively produced signal connecting networks with local functions implemented in the inner structural areas such as flexible connectors.

FIG. 9 Part of another exemplified embodiment of an inventively produced connecting substrate with locally implemented functions in outer structural areas such as heat dissipation, flexible connectors and interfaces to the exterior via electrical and/or optical sensors.

FIGS. 10 to 13 Parts of further exemplified embodiments of inventively produced connecting substrates with local functions implemented in inner structural areas such as flexible connectors and partly folded and stiffened as compact connecting substrates.

FIGS. 14 & 15 Parts of further exemplified embodiments of inventively produced connecting substrates with local functions implemented in outer structural areas such as heat dissipation and in part folded and stiffened as compact connecting substrates.

FIG. 16 Part of another exemplified embodiment of an inventively produced connecting substrate or stylized laptop with local functions implemented in the outer structural areas such as mechanical supports, heat dissipation, flexible connectors and interfaces to the exterior, the stiffening part being constructed as a housing.

To illustrate the invention FIGS. 1 and 2 show typical embodiments of connecting substrates with primary and secondary functions merged in a unitary structural design to form a single common function, in accordance with the prior art. In the multilayer structure according to FIG. 1 signal conductors 1 and power supply conductors 2 are constructed in a dielectric 3 as the mechanical support. Layers of thin signal conductors 1 and thicker power supply conductors 2 connect the components of one plane. Relatively long and thick interfacial connections or Z-conductors 5 pass through the entire multilayer structure. In the multilayer structure according to FIG. 2 the heat dissipation and power supply take place via an inner, thick core. The heat dissipation of the external, loaded components takes place in the interior of the multilayer structure and heats the latter. The disadvantages of this construction were discussed in detail hereinbefore.

FIG. 3 shows in section and diagrammatically part of an exemplified embodiment of a connecting substrate produced according to the invention with modular designed and functionally separated structural design. A similar design with optical means is shown in FIG. 5. The functions "signal conductor", "power supply", "assembly surfaces", "mechanical strength", "heat sinks", "flexible connectors", "interfaces to the exterior", etc. are e.g. implemented and optimized in a functionally separated design process. In a hierarchic union the functional areas are obtained with equal rights in a mutual design process according to the structural prerequisites. For example, a signal connecting network with loaded components and heat sinks is designed, which can be folded and stiffened via flexible connectors. These processes are individually monitored and separately optimized in functionally specific manner in the case of functionally specific error values. If e.g. following a folding excessive temperatures are measured in specific, reversed connecting substrate areas, a correction is worked out in conjunction with other functions. This correction can be very complicated and there are a correspondingly large number of possible correction solutions. For example, signal switching lines are deflected and the components are located at other loading places, e.g. the transmission of mechanical characteristics by flexible connectors is differently designed, so that the components, following bending/folding, are differently positioned and e.g. locally a heat sink is incorporated. Thus, the aforementioned principle of functionally separated structural design is implemented and the structural prerequisites inner : fine, dense, flexible and cool
outer : coarse, rigid and warm are fulfilled. The resulting overall circuit can be universally varied, as will be described hereinafter.

Signal connecting network: The signal connecting network 19 forms the interior of the connecting substrates to be produced in dense, fine form according to the approximately structural prerequisites. By optimizing the signal switching functional area "signal conductor" a signal connecting network 19 is provided with high density signal conductors and consequently brought very close to the connections or terminals of the components 4. Such a production method is e.g. disclosed in the DY-COstrate$^{(R)}$ method of the applicant, such as is e.g. described in WO 92/15408 and WO 93/26143. Parts of exemplified embodiments of electrical and/or optical signal connecting networks 19 are shown in FIGS. 4 and 5 and are described relative thereto. The signal connecting network 19 is produced in separate method stages and can be separately pretested, i.e. it is testable in very early production stages before any combination takes place with other functional units, so that wastage of connecting substrates is drastically reduced. The signal connecting network can be produced either loaded or unloaded in a roll to roll process, intermediately stored and consequently forms a starting product.

Power supply: The electric power supply 2 is generally associated with the signal switching functional area, but in principle can also be functionally separated and separately optimized. Power supply conductors are also coarsely structured compared with signal conductors and can e.g. be produced in parallel or together with the signal connecting network 19 as signal connecting structural areas. Such a production method is e.g. disclosed in the DYCOstrate$^{(R)}$ method of the applicant, e.g. in WO 92/15408 and WO 93/26143. Here again the power supply 2 can be intermediately stored and is consequently a starting product and following implementation can be pretested for early fault detection and waste reduction. Any corrections can be performed rapidly and easily, because the electric power supply 2 is not at this production stage covered by other functional units, e.g. mechanical support material 7.

Assembly/mounting locations: On the flat, flexible signal connecting network 19 and on the electric power supply 2 are loaded on one and/or both sides at loading locations components 4. All three dimensions, the surface with XY-conductors and the thickness with Z-conductors are consequently utilized for an optimum routing. The total thickness of the signal connecting network 19 and the electric power supply 2 is small, e.g. below 500 μm, the components 4 being mutually arranged with optimum, ultra-short spacings, so that the signal conductors between the components 4 are as short as possible, i.e. for example with the order of magnitude of the circuit thickness. The shorter the signal conductors, the easier the implementation of the design and the faster the transmission and the lower the fault influences. These short signal conductors are indicated as arrows between the components 4. The components 4 are e.g. unpacked, integrated circuits or packed SMD components, which are electrically connected to the signal connecting network by appropriate methods such as soldering, bonding, wire bonding or TAB bonding. The components 4 can e.g. also be passive, electrical and/or optical components 4 such as resistors, capacitors, inductance coils, subsequently contactable circuit components, waveguides, splitters, combiners, mirrors, etc. However, such passive components 4 can also be implemented in the interior of the signal connecting network 19 or the electric power supply 2.

Mechanical strength: The mechanical strength is produced separately from other functions and is therefore separately optimized. Around the thin signal connecting networks 19 provided with a power supply 2 and loaded with components 4 is produced in separate production stages a mechanical support 7, so that in a local, planned manner there is an easily adjustable stiffening to give an intermediately storable intermediate product. Parts of exemplified embodiments of mechanical supports 7 for connecting substrates are shown in FIGS. 7 to 16 and are described in detail in conjunction therewith. Areas covered with mechanical support material 7 are harder and stiffer, whereas those which are not covered are softer and more flexible. In order to incorporate a great variability of different mechanical characteristics, the stiffness is implemented in outer structural areas according to the approximate structural prerequisites.

Heat sinks: Around the thin signal connecting networks 19 provided with a power supply 2 and loaded with components 4 is implemented in separate production stages a heat management, so that the heat generated by the active components 4 is passed in a planned, local manner to the outside, where it is dissipated. Thus, the approximate structural prerequisites of inside "cool" and outside "warm" are implemented. Such an exemplified thermal layout is shown in FIGS. 14 and 15 and will be described in conjunction therewith. As a result of the limited thickness and weight the signal connecting network 19 and power supply 2 absorb small heat quantities. Specifically heat sinks 20 fitted to heat sources locally conduct the heat to externally fitted thermal conductors or cooling bodies 21, where it is dissipated.

Flexible connectors: Structural areas of the connecting substrate uncovered by mechanical support material 7, due to their comparatively higher flexibility serve as flexible extension arms and can be used in various different ways. Through engagement of rigid-flexible structural areas, the connecting substrates can be bent round and in this way folded and/or wound, so that after stiffening bent round areas compact connecting substrates are obtained. Embodiments of such flexible connectors are shown in FIGS. 7 to 16 and will be described in conjunction with therewith.

Interfaces to the exterior: Independently of whether flexible, signal connecting structural areas or components are or are not covered with mechanical support material 7, signal connecting structural areas of the connecting substrate can be used in various ways as interfaces to the exterior. Exemplified embodiments of interfaces to the exterior are shown in FIGS. 7 to 16 and will be described in conjunction therewith. Thus, the nonreinforced, flexible signal connecting structural areas 19, 2, form bendable, connectable interfaces for the fitting of the connecting substrate in an apparatus housing and for producing electrical, optical and mechanical connections, e.g. via ends stiffened to form plugs of such signal connecting structural areas 19, 2, or e.g. via optical couplers as integrated or loaded components, or e.g. as shields, transmitters or antennas. For the production of such contours in a connecting substrate is e.g. suitable the DYCOstrate$^{(R)}$ method of the applicant, as disclosed in PCT/CH94/00092. With the knowledge of the present invention the expert has numerous possibilities for varying such interfaces to the exterior.

FIG. 4 shows part of an exemplified embodiment of an electrical signal connecting network 19 produced using the method according to the invention in a multilayer conductive and insulating material, structured in known, wet chemical etching processes and/or in known plasma etching processes. A known structuring process is disclosed in the method of the applicant, e.g. according to WO 92/15408 and WO 93/26143. The materials used are simple, inexpensive and functionally optimized. Use is made of thin, metal-coated films, e.g. thin polyimide films, liquid crystal polymers or epoxy resin films (12 to 100 $\mu$m thick) coated with a thin copper foil (3 to 70 $\mu$m thick). For example, use is made as the starting material of a three-layer foil with two outer layers of conductive material insulated from one another by an intermediate, insulating material layer. A wiring pattern with XY-conductors is etched out of the two conductive layers. Through the intermediate insulating layer is etched out a wiring pattern of signal conductors 1 with XY-conductors 6 structured in the conductive material layers and with sloping or vertical Z-conductors 5, such as is e.g. disclosed in the applicant's EP 575292. During etching processes for the Z-conductors, resist coatings protect those parts which are not to be etched away. The resist coatings can be metal coatings, photoresist coatings or removable, covering metal coatings, such as are disclosed in the applicant's PCT/CH94/ 00134. In this way is formed a three-dimensional signal connecting network 19 with signal conductors 1, subdivided into XY-conductors 6 and Z-conductors 5 and separated by a dielectric 3. One or more layers of an electric power supply are implemented in or on the signal connecting network 19. Advantageously four or six-layer, signal switching structural areas 19, 2 are implemented with two or more inner layers of signal conductors of a signal connecting network of X, Y and Z-conductors and with one or two outer layers of feed conductors of a power supply 2.

In order to prevent undesired effects occurring in high frequency applications, such as e.g. high damping, reflection or cross talk of signals, it is necessary not only the spacings, but also the widths of the signal switching conductors to be designed with specific, narrow size relationships. The uniform dielectric thicknesses, small damping values and dielectric constants, as well as the narrow tolerances of the dielectric constants of the foils used in the X, Y and Z-directions are eminently suitable for such requirements. Thus, the present invention leads to circuits which, due to the thin metal and nonmetal layers (in each case 12 to 150 $\mu$m thick) and the small interfacial connections (diameter smaller than 100 $\mu$m, lengths smaller than 500 $\mu$m), which are eminently suitable for uses in the high frequency sector. This is of great technical significance, because the tendency is that e.g. future personal computers will not only operate at very high speeds in the central computing program (several hundred megahertz), but also such clock frequencies are sought for the bus system on the connecting substrates. This is difficult to achieve with standard, function-merging connecting substrates due to the macroscopic dimensions of layer thicknesses and conductor widths, and due to the varying composition and changing thickness of the glass fibre fabric dielectric and the varying thickness of the epoxy or polyimide resin matrix.

FIG. 5 shows a detail of another exemplified embodiment of an inventively produced signal connection with optical means combined to a connecting substrate. FIG. 5(*a*) is a perspective view of the detail, in which the rigid support material 7 is partly removed, so that it is possible to see the elements enveloped by the supporting structure. FIG. 5(*b*) is a crosssection through such a signal connecting network. The technical features of FIG. 5 are largely based on those according to FIGS. 3 and 4, so that they need not be described again. Unlike in FIG. 4, according to FIG. 5, an exemplified optical signal connecting path 19 with a waveguide 1 and optical deflecting means 10 such as mirrors, combiners or splitters is implemented in the signal connecting networks 19. Active and passive, optical components such as lasers, LED's, detectors or optical couplers are also integrated in the connecting substrates. Thus, it is possible to implement optically conducting interfacial connections from the exterior, via components 4 and deflecting means 10, to waveguides 1, so that a transmission/ reception of broad-band optical signals is possible and optical signals are switched. Optical and electrical components switch signals across the opto-electrical signal connecting network 10. Here again very short distances are implemented between the optical and electrical components 4 and the three-dimensional, opto-electrical signal connecting network 19 can be pretested and intermediately stored.

FIG. 6 diagrammatically shows part of another embodiment of a signal connecting network 19 produced according to the inventive method and with different embodiments of signal paths 5, 6 between components 4. With reference to this description of FIG. 4, a multilayer signal connecting network 19, e.g. of four layers of signal connecting network elements according to FIG. 4, is structured and loaded with components. The components 4 are e.g. self substance soldered, microwelded (wire bonded), adhesively bonded or contacted by alternative connecting methods to the signal connecting network 19. In several conductive layers, separated from one another by insulating layers 3, are etched out a signal connecting network with XY-conductors 6 and Z-conductors 5 sloping or perpendicular thereto. When using the aforementioned, thin foil material, the entire signal connecting network 19 is e.g. thinner than 500 Tum and is pretestable and intermediately storable prior to modular combination with other functional parts.

Individual Z-conductors 5 always connect two structured conductive layers, which are separated by a single, structured insulating layer 3. The entire signal connecting network 19 has paths of electrically interconnected Z-conductors 5 through insulating and conductive layers. As a function of the structuring of said paths, e.g. as a function of their length, more or less differently structured conductive layers are interconnected. In special cases the paths of Z-conductors extend through the entire signal connecting network 19 and permit the electrical connection of components 4 of the network 19 loaded on different sides at loading locations. According to FIG. 6 two embodiments of such Z-conductor paths are designed for the signal transmission between-side loaded components 4 through the entire signal connecting network 19. On the left side of FIG. 6 are e.g. alternating, sloping Z-conductors 5 and on the right side thereof mutually displaced, vertical Z-conductors 5. The sloping Z-conductors 5 interconnect two components 4. The mutually displaced Z-conductors divide and run in parallel displaced manner through the signal connecting network 19. They e.g. interconnect three components 4, one on the top of the signal conducting network 19 according to FIG. 6 to two components 4 on the underside of the network 19. With the knowledge of the present invention the expert knows how to implement further embodiments, such as e.g. combinations of vertical and sloping Z-conductors.

FIGS. 7 and 8 show parts of further exemplified embodiments of inventively produced signal connecting networks with local functions implemented in inner structural areas such as flexible connectors. The design of mechanical characteristics takes place in a functionally separated manner. On a signal conducting network 19 are arranged as rigid elements components 4 such as integrated circuits, etc. What is important in the mechanical functional area is that the rigid elements 4 and/or functional areas stiffened with mechanical support material 7 are less flexible than the signal connecting network 19 and can even be rigid.

In this way there can be a random mechanical complexity of a connecting substrate. An example is shown in FIG. 7 in which, diagrammatically represented, rigid areas X1, X2, X3, etc. are produced, which are in each case separated by flexible areas Y1, Y2. Another example is shown in FIG. 8, in which a signal connecting network 19 is placed by an angle of e.g. 90° round a flexible area Y. Such arrangements can e.g. be spirally wound to a roll. With other rigid/flexible arrangements it is possible to obtain stacks, concertina folds and other folds or bends in a functionally separated manner. The signal switching and thermal requirements are separately developed, but each stage is in each case monitored by two other functional areas, is also evaluated and on diverging from the predetermined, functionally separated standard a modification is made. FIG. 9 shows a part of another exemplified embodiment of an inventively produced connecting substrate with local functions implemented in outer structural areas such as heat dissipation, flexible connectors and interfaces to the exterior.

Stiffening with mechanical support material 7 takes place in locally, planned manner. This stiffening e.g. takes place at bent round or folded connecting substrates 19, 2 according to FIGS. 8 to 13 and represents a superimposing of mechanical complexities in rigid/flexible areas. A first mechanical complexity relates to the planned folding according to flexible areas, a further mechanical complexity relating to the planned stiffening of this folded product. The flexibility, bending radii of the flexible area and hardnesses of the stiffening are to be optimized as local functions in planned local manner, in successive production stages with different functionally specific materials. The flexible areas are e.g. flexible films of the inner structural areas. They are prestiffened to a greater or lesser extent with components, rigid elements or applied stiffening means. The definitive stiffening in the rigid areas takes place by functionally specific stiffening means. The stiffening means can e.g. be commercial self substance, positive and non-positive means such as injection moulded plastic, drawn over shrink hose, applied curing pastes, adhesive films, etc. With the knowledge of the present invention the expert has numerous possibilities.

Independently of whether the flexible, signal connecting structural areas or components are covered or not covered with mechanical support material 7, signal connecting structural areas of the connecting substrate can be used in many different ways as interfaces to the exterior. Thus, the non-reinforced, flexible, signal connecting structural areas 19, 2 e.g. form flexible, connectable interfaces for the assembly or fitting of the connecting substrate in an apparatus housing and for producing electrical, optical and mechanical connections, e.g. by means of ends, stiffened to plugs 23, 24, of such signal connecting structural areas 19, 2. For example, interfaces to the exterior can also be produced via optical windows 25 made in the support material. In addition, locally also electromagnetic shields 26 and/or interfaces such as transmitting or receiving antennas are conceivable. With the knowledge of the present invention, the expert has numerous possibilities for varying such interfaces to the exterior.

FIGS. 10 to 13 diagrammatically show parts of further exemplified embodiments of inventively produced connecting substrates with local functions implemented in the inner structural areas such as flexible connectors and in part bent round and stiffened as folded connecting substrates. The technical features according to FIGS. 10 to 13 are largely based on those of FIG. 9, so that they will not be described again. Unlike in FIG. 9, in FIGS. 10 to 13 exemplified folds of connecting substrates are shown, which reduces the space consumption of such substrates. The advantages resulting from such folding are obvious. Far more components per volume unit can be wired. Such a folding is only possible as a result of the functionally separated structural design of the connecting substrates according to the invention.

FIG. 10 shows a sinuous folding of a signal connecting network 19, 2 e.g. equipped on both sides with components 4 and the stiffening of said fold as a rigid area 6 by means of a mechanical support 7. Signal switching structural areas 19, 2 projecting from the stiffening X e.g. serve as interfaces to the exterior in the form of flexible areas Y.

The signal switching structural areas 19, 2 projecting from the stiffening X e.g. serve as interfaces to the exterior in the form of flexible areas Y.

Figure 1:
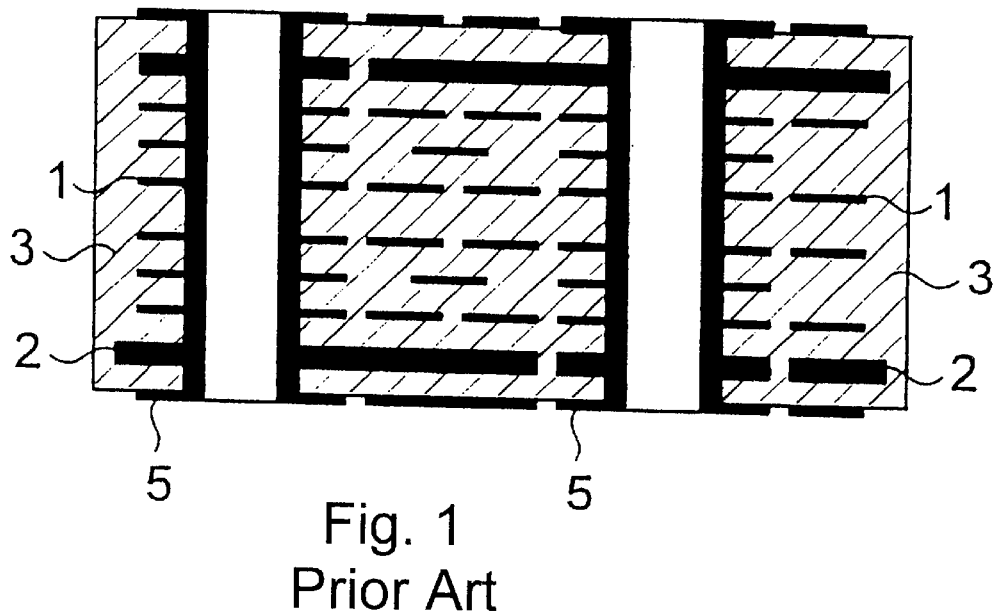
Figure 2:
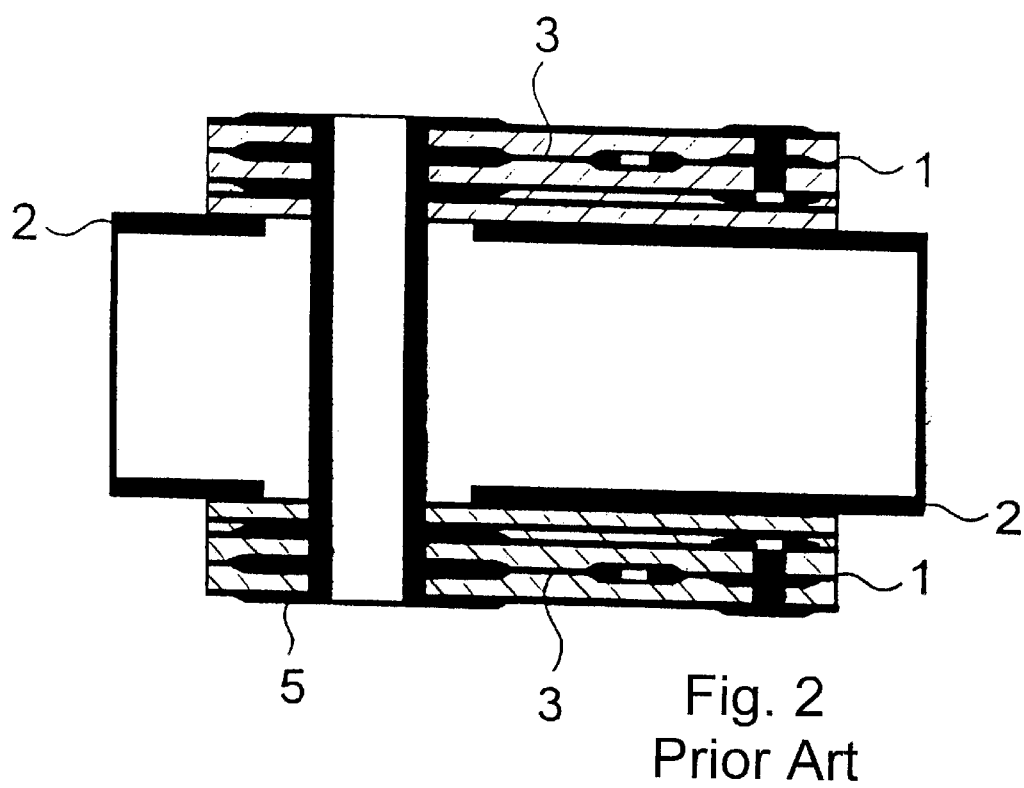
Figure 3:
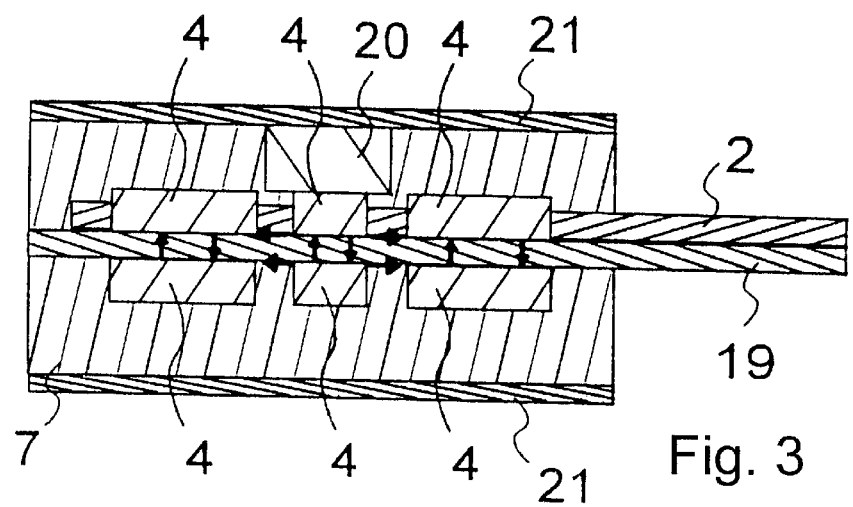
Figure 4:
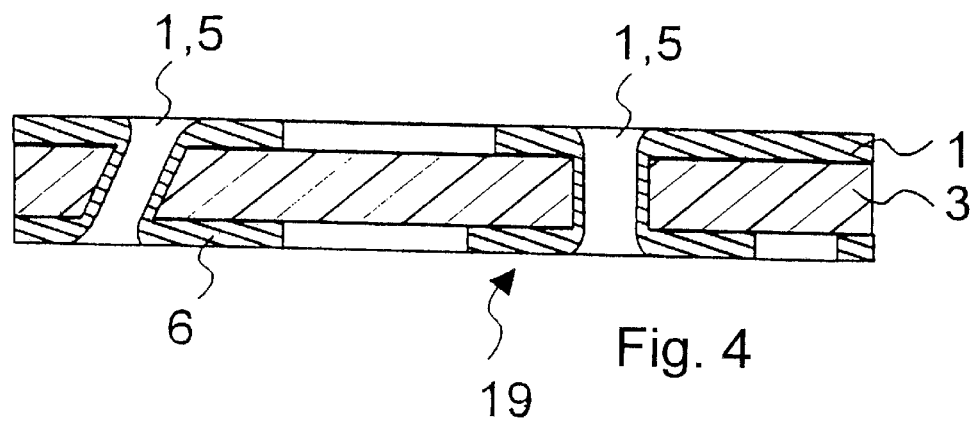
Figure 6:
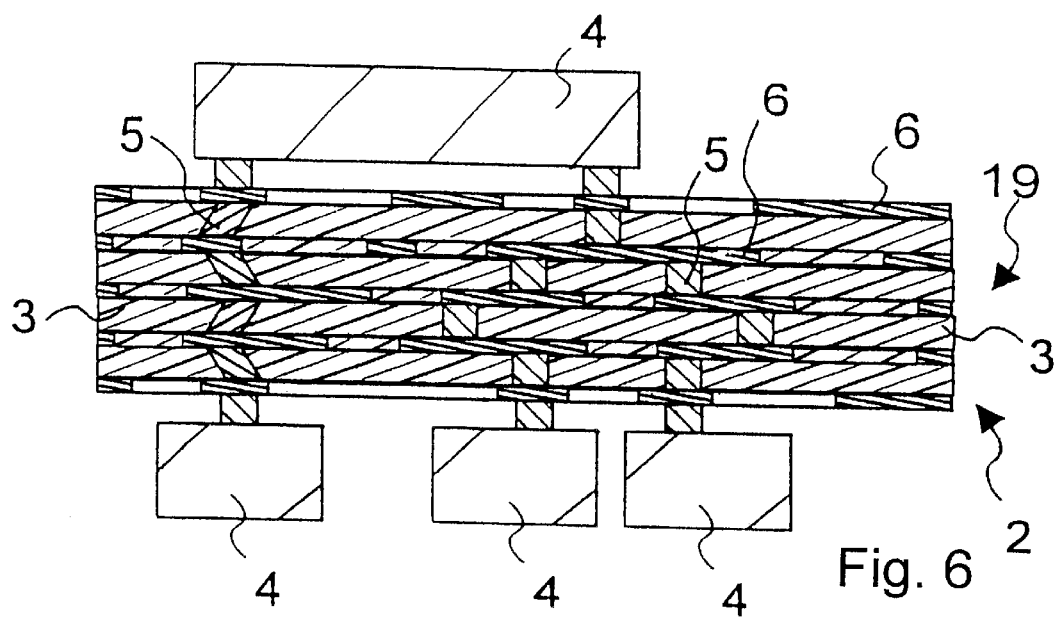
Figure 5:
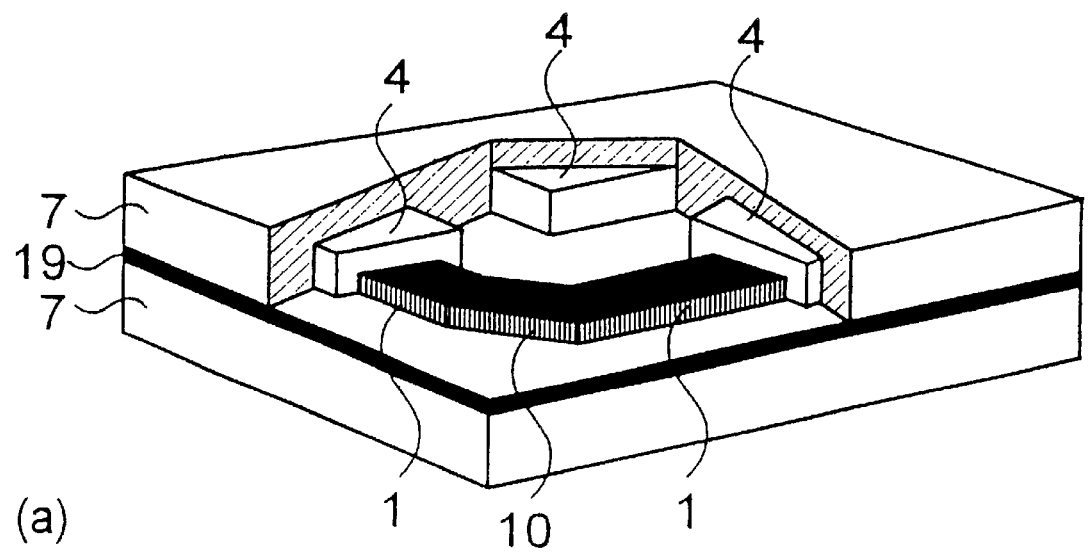
Figure 5:
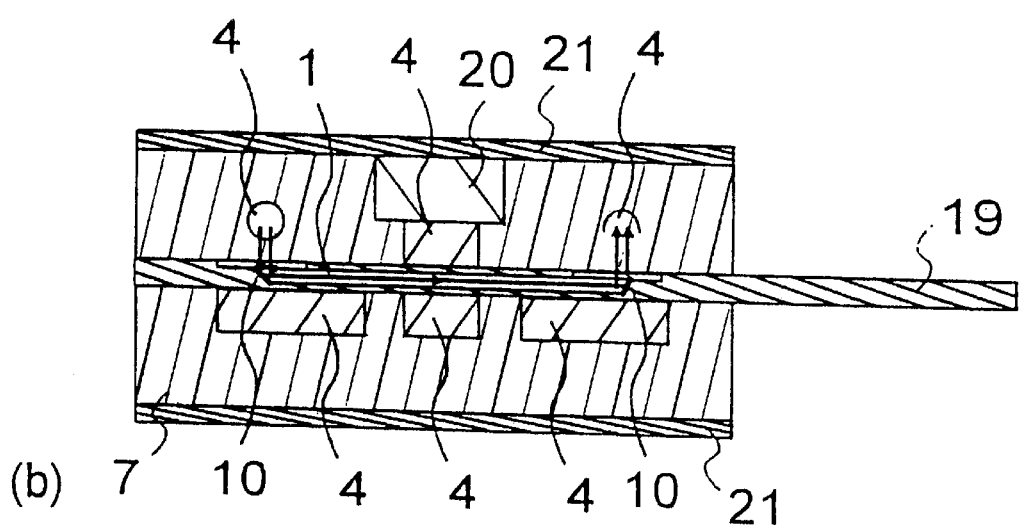
Figure 7:
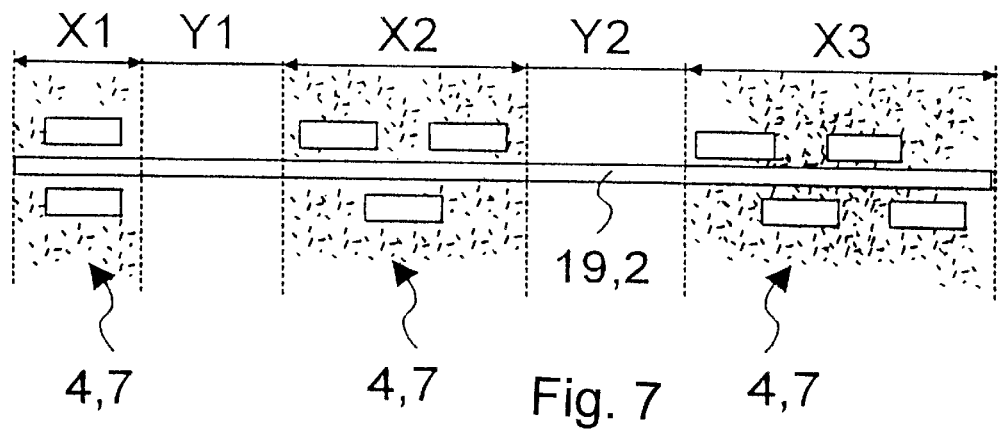
Figure 8:
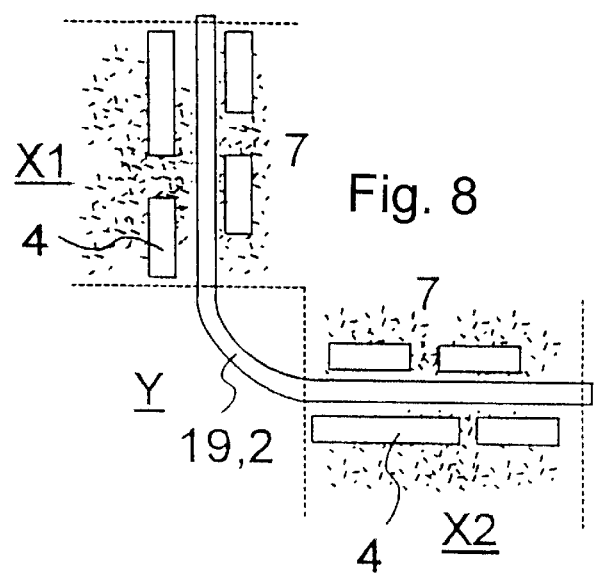
Figure 10:
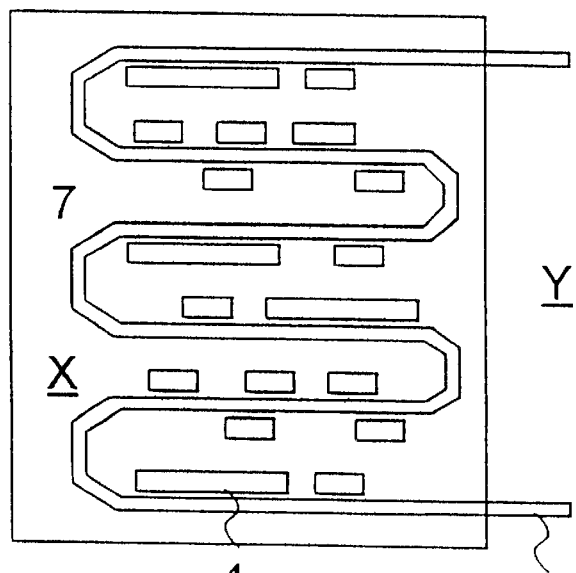
Figure 9:
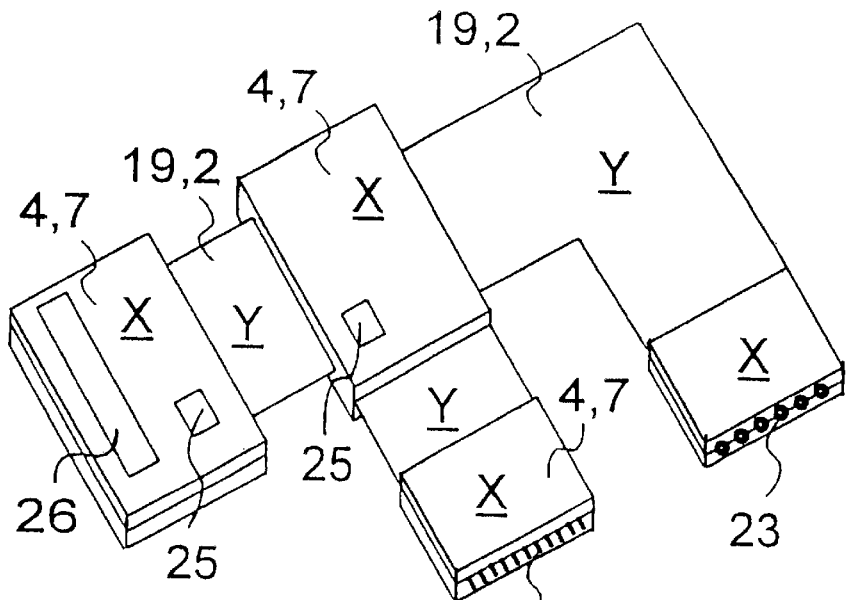
Figure 11:
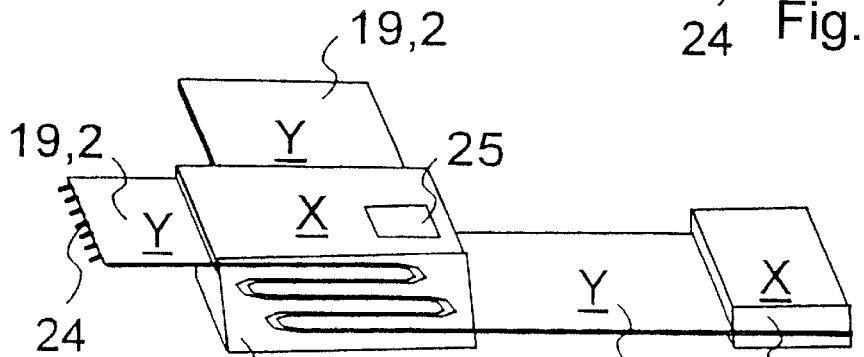
FIG. 11 shows a similar embodiment of a sinuous fold as part of a connecting substrate with rigid/flexible areas according to FIG. 9.
Figure 12:
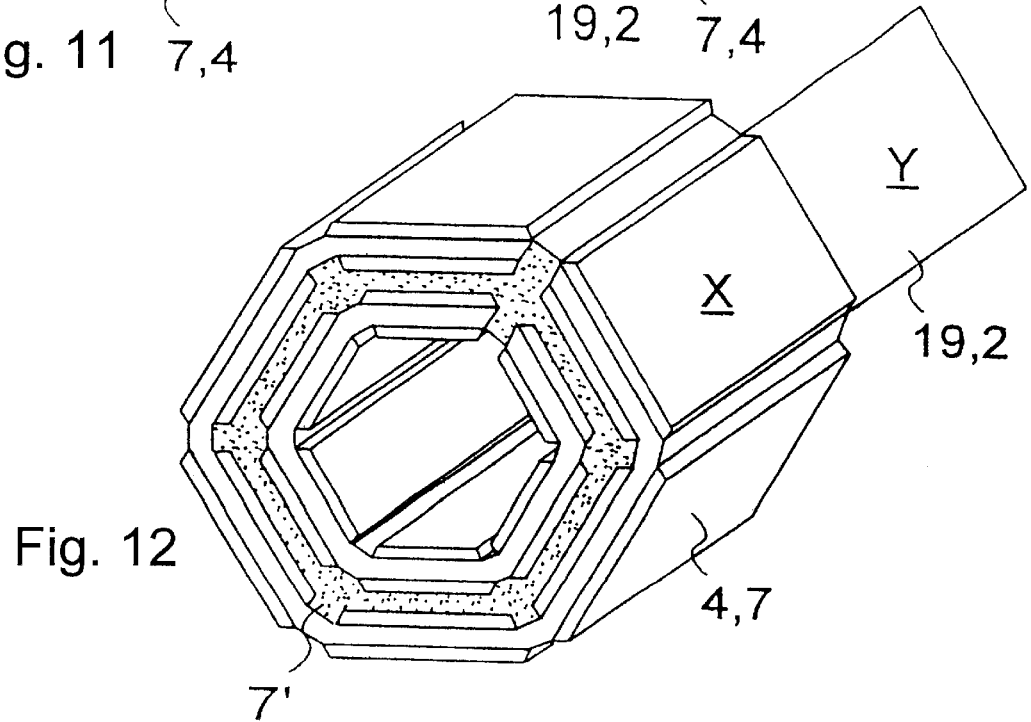
FIG. 12 shows an embodiment as a wound overall circuit, where two connecting substrates with different bending radii are wound over one another and mechanically stiffened 7'.
Figure 13:
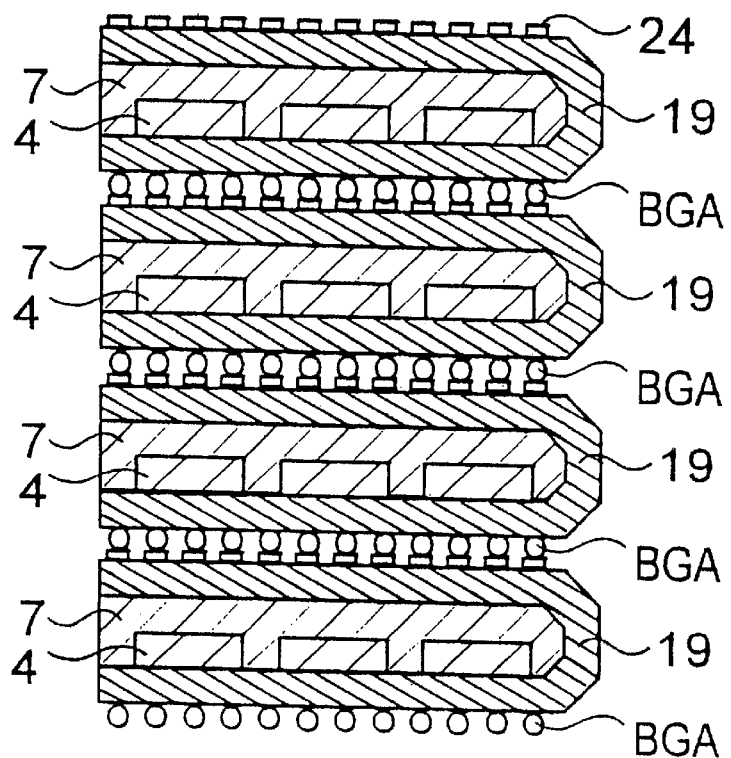
Figure 14:
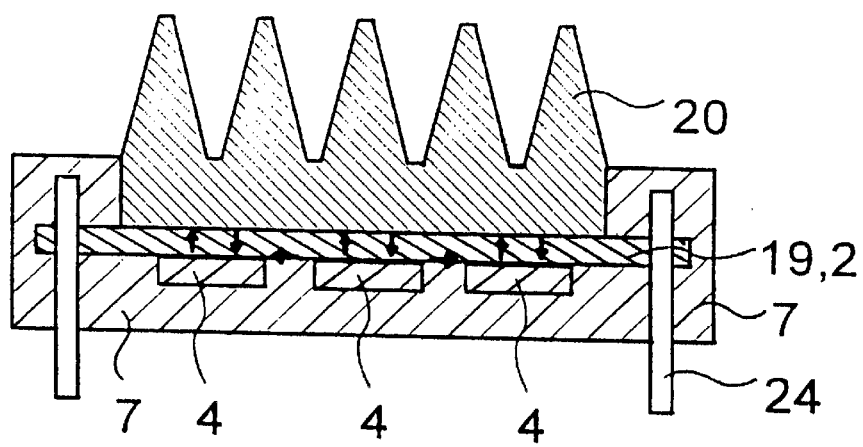
Figure 15:
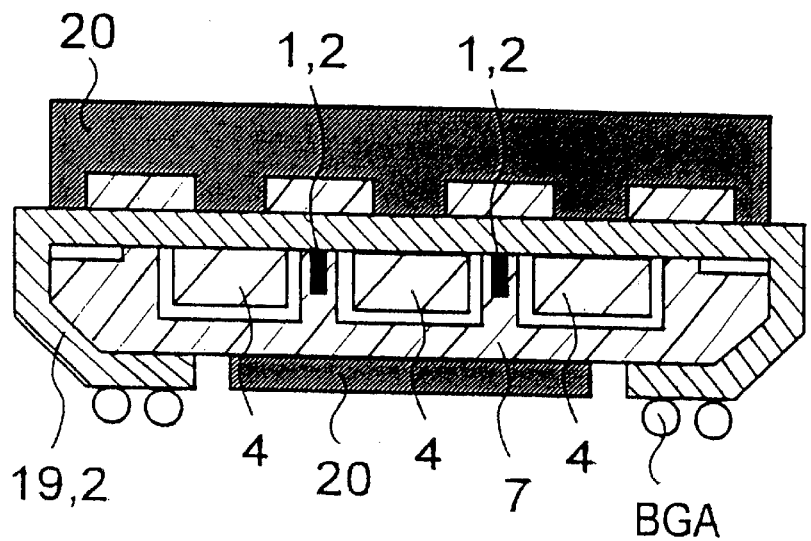

FIG. 13 shows an embodiment as a superimposed overall circuit, where several more or less identical connecting substrates are superimposed and interconnected in signal connecting and mechanically stiffening manner by an electrical connecting means in the form of small solder balls (ball grid array, BGA) or anisotropic conductive adhesives. FIGS. 14 and 15 show parts of further exemplified embodiments of inventively produced connecting substrates with local function simplemented in the outer structural areas such as heat dissipation and in part folded and stiffened as compact connecting substrates. The heat dissipation is integrated into the connecting substrate in accordance with the thermal layout disclosed in the applicant's PCT/CH93/00148 and implemented by means of heat conductors and heat collecting elements. The characteristic quantities are then, based on the layout symbols, the heat absorption capacity of heat collectors (similar capacitors),the heat conducting capacity of heat conductors (similar electrical conductors), the heat emitting capacity of heat radiators (radiation, convection, similar inductance coils), heat sources (similar voltage sources) an d heat sinks (similar earths). On a conducting substrate there are usually several heat sources, which are the activated components, well applied heat capacitors and heat conductors and where possible radiators (cooling bodies) and heat sinks of a more solid construction. A rough, model-based approximation is readily possible.

FIGS. 14 and 15 show exemplified implementations of heat collecting points 20, contacted by heat conductors and dissipating heat into the sink. The heat collecting points can be in the form of radiators in the upper part, accumulators in the middle part and heat conductors in the lower part. The heat e.g. generated by active components 4 is conveyed in planned, local manner to the exterior.

Figure 16:
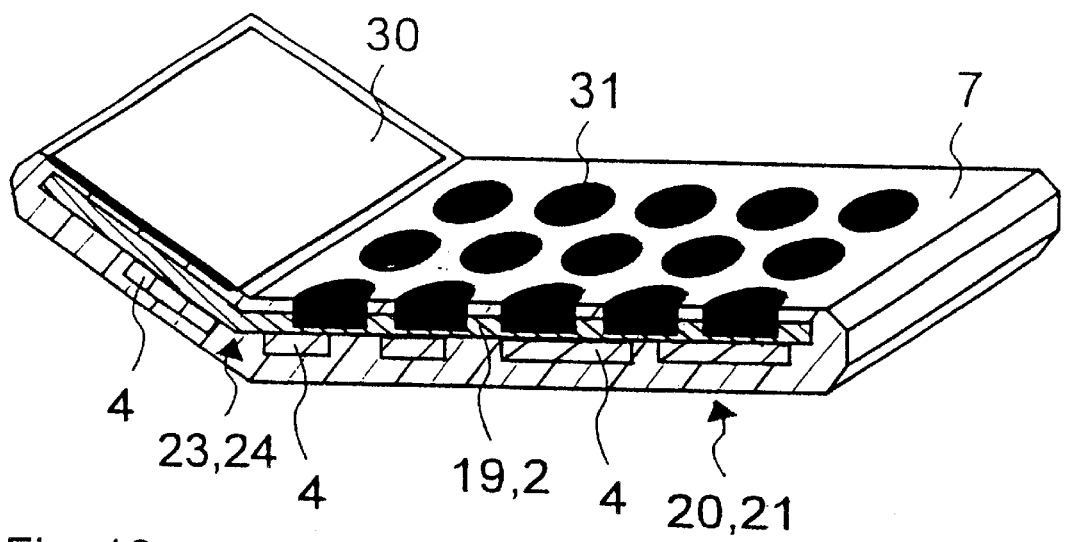

FIG. 16 shows part of an inventively produced connecting substrate in the exemplified embodiment of a stylized laptop. This example illustrates how the mechanical connecting substrate part is a separately planned, separately optimized and separately produced module in the form of an apparatus housing part or apparatus housing. During the design and connection of the modules to the overall circuit embodying the connecting substrate the apparatus housing 7 forms the mechanical substrate part, which is rigid on the outside and on the inside are provided the signal conducting substrate parts 19, which are internally flexible and dense, as well as component-carrying substrate parts with the components 4. The thermal substrate parts 20, 21 conduct heat to the outside, here into the bottom of the housing. The interfaces to the display 30 and keyboard 31 are not visible from the outside.

According to the invention an apparatus can be so planned and implemented that the design of the connecting substrate takes place in functionally separated manner, in that signal conducting substrate parts or power supplying substrate parts 19, 2, thermal substrate parts 20, 21, mechanical substrate parts 7 (here the housing) and the arrangement of the components 4 or component-carrying substrate parts are separately planned, optimized and produced as interdependent functions or modules and finally associated with spatially separated functional areas (internally flexible/externally rigid) of the overall circuit (here the apparatus), the design taking place by the connection of the modules to an overall circuit embodying the connecting substrate (here to an apparatus).

A multilayer connecting substrate in the form of an apparatus with a conductor network, components and mechanical stiffening elements essentially in the form of a housing is constructed as follows:

the substrate parts with the fine, dense, flexible elements are associated with the inner areas of the overall circuit or apparatus;

the substrate parts with the rigid elements and/or components are associated with the outer areas of the overall circuit or apparatus;

a stiffening support material is so placed in the outer area that the circuit is given a mechanical support structure, which is locally rigid passing into flexible areas and can be designed as a housing;

the overall circuit can be folded and/or wound corresponding to the rigid and flexible portions, has interfaces and is part of the overall apparatus.

The method for the manufacture of multilayer connecting substrates with multiple functions is, in summary form, that the design of the connecting substrate takes place in functionally separated manner, in that signal conducting substrate parts 19, power supplying substrate parts 2, mechanical substrate parts 7, as well as the arrangement of the components 4 or component-carrying substrate parts are separately planned and optimized as interdependent functions or modules and finally associated with spatially separated functional areas (inner/outer/ of the overall circuit, the design taking place by the connection of modules to an overall circuit embodying the connecting substrate. The resulting multilayer connecting substrate with conductor network, components 4 and mechanical stiffening elements 7 has the following construction. The substrate parts with the fine, dense and flexible elements are associated with the inner areas of the overall circuit, the substrate parts with the rigid elements and/or components are associated with the outer areas of the overall circuit and a stiffening support material 7 is so placed in the outer area that the circuit is given a mechanical support structure, which is locally rigid and passes into flexible areas, the overall circuit being folded and/or wound corresponding to the rigid and flexible portions.

What is claimed is:

1. A method for manufacturing a modular designed, multilayer connecting substrate having inner and outer layers with electrical and/or optical multiple functions, said multilayer connecting substrate being formed from a plurality of substrate elements, comprising the steps of separately fabrication and independently testing a signal conducting substrate element (19), a power supplying substrate element (2), a thermally conductive substrate element (20) and mechanical substrate elements (7), mounting components on the signal conducting substrate element (19) and on the power supplying substrate element (2), and, assembling the multilayer connecting substrate by:

placing the signal conducting substrate element (19) and power supplying substrate element (2) as inner layers of the multilayer connecting substrate, placing the mechanical substrate elements as outer layers of the multilayer connecting substrate so as to provide mechanical stiffness to the multilayer connecting substrate and protection for the inner layers, and thermally connecting the signal conducting and power supplying elements (19, 2) to the thermally conductive substrate element (20) so as to convey heat from the inner layers to the outer layers.

2. The method according to claim 1 including connecting heat emitting (21) and thermally conductive substrate elements to the mechanical substrate elements (7), so that the signal conducting and power supplying elements (19, 2) are at least partly enclosed by the mechanical substrate elements.

3. The method according to claim 1, comprising the further step of forming the signal conducting, and power supplying substrate elements (19, 2) with one or more layers of conductor films having conductor paths interconnecting layers and with connection points to the components (4).

4. The method according to claim 1, wherein the mechanical substrate elements (7) are formed so as to have different strengths over their spatial extension.

5. The method according to claimed 4 including the step of integrating components (components (4), heat sinks (20), etc.) as mechanical elements in the mechanical substrate.

6. The method according to claim 5 including the steps of engaging mechanical substrate elements (7) with the signal conducting and power supplying substrates (19, 2) and creating, substantially rigid and substantially bendable portions which permit one or more folds of an overall connecting substrate, with circuit means formed thereon.

* * * * *

UNITED STATES PATENT AND TRADEMARK OFFICE
CERTIFICATE OF CORRECTION

PATENT NO.   : 6,321,443 B1
DATED        : November 27, 2001
INVENTOR(S)  : Barte et al.

It is certified that error appears in the above-identified patent and that said Letters Patent is hereby corrected as shown below:

Column 9,
Line 11, delete "Tum" and insert -- μm --.

Column 11,
Line 24, delete "an d" and insert -- and --.

Column 12, claim 1,
Line 51, delete "fabrication" and insert -- fabricating --.

Signed and Sealed this

Second Day of April, 2002

Attest:

Attesting Officer

JAMES E. ROGAN
Director of the United States Patent and Trademark Office